United States Patent [19]

Bolger

[11] Patent Number: 4,543,600
[45] Date of Patent: Sep. 24, 1985

[54] DIGITAL SIGNAL PHASE MEASURING APPARATUS AS FOR A PHASE-LOCKED LOOP

[75] Inventor: Thomas V. Bolger, Merchantville, N.J.

[73] Assignee: RCA Corporation, Princeton, N.J.

[21] Appl. No.: 533,819

[22] Filed: Sep. 19, 1983

[51] Int. Cl.$^4$ .............................................. H04N 9/46
[52] U.S. Cl. ..................................... 358/13; 375/119; 377/43
[58] Field of Search ................. 358/13; 375/118, 119; 328/63; 307/269; 377/43, 39

[56] References Cited

U.S. PATENT DOCUMENTS

| | | | |
|---|---|---|---|
| 4,122,487 | 10/1978 | Beaulier et al. | 358/13 |
| 4,280,099 | 7/1981 | Rattlingourd | 328/63 |
| 4,291,332 | 9/1981 | Kato et al. | 358/19 |
| 4,393,397 | 7/1983 | Holmes | 358/36 |
| 4,402,005 | 8/1983 | Lewis | 358/28 |
| 4,462,110 | 7/1984 | Baldwin | 377/43 |
| 4,471,299 | 9/1984 | Elmis | 307/269 |

FOREIGN PATENT DOCUMENTS

| | | |
|---|---|---|
| 0067899 | 12/1982 | European Pat. Off. . |
| 0071745 | 2/1983 | European Pat. Off. . |
| 0071505 | 2/1983 | European Pat. Off. . |
| 0071506 | 2/1983 | European Pat. Off. . |
| 0074597 | 3/1983 | European Pat. Off. . |
| 2081050A | 2/1982 | United Kingdom . |

OTHER PUBLICATIONS

ITT Auto Flesh Processing Circuit.

Primary Examiner—John W. Shepperd
Attorney, Agent, or Firm—E. M. Whitacre; P. J. Rasmussen; E. P. Herrmann

[57] ABSTRACT

A phase measuring arrangement for sampled signals changes the phase of the sampling signal in fine phase increments while comparing the magnitudes of the signal samples so produced to determine whether they have magnitudes within a given range of values. The range of values is indicative of a known phase angle. The number of magnitudes falling within the given range is indicative of the phase of the sampled signal relative to the known phase angle. Embodiments are disclosed in which such phase measuring arrangement is employed in a phase-locked loop useful for processing chrominance signals in a television receiver.

21 Claims, 6 Drawing Figures

| SIGNAL | Δφ | CT |
|---|---|---|
| 310 | +4° | 3 |
| 312 | 0° | 5 |
| 314 | −4° | 7 |

DIGITAL SIGNAL PHASE MEASURING APPARATUS AS FOR A PHASE-LOCKED LOOP

The present invention relates to apparatus for digitally measuring the phase of digital signals relative to that of a reference signal.

In color television (TV) systems, for example, it is necessary to synchronize a color subcarrier oscillator of the receiver with a color subcarrier reference burst component of received video signals. This is usually done with a phase-locked loop (PLL) including a voltage-controlled oscillator (VCO), a phase comparator which is gated to be active during the color reference burst interval of each TV line, and a loop filter.

In analog PLLs which operate with continuous and usually sinusoidal signals, phase-error at the locked condition can be reduced to an acceptable level by the inclusion of sufficient gain in the PLL circuits. In TV receivers in which signals are digitized by an analog-to-digital converter (ADC) and thereafter processed digitally, it is preferred that a digital PLL be employed for color subcarrier synchronization. Digital PLLs have a VCO producing a series of digital pulses at the desired frequency (sampling frequency) and have the color subcarrier reference burst component represented by a series of digital numbers indicative of its analog magnitude at the time it was sampled by the ADC. It is convenient that the VCO operate at four-times the frequency $f_{sc}$ of the color subcarrier signal, i.e., the sampling frequency is $4f_{sc}$ which is about 14.3 megaHertz (MHz) in the NTSC TV system and about 17.7 MHz in the PAL TV system.

The limited number of digital samples (four per color subcarrier cycle) and limited quantizing resolution inherent in the ADC (typically 7–8 bits) make accurate measurement of the phase error between the $4f_{sc}$ sampling signal produced by the VCO and the received digitized color subcarrier reference burst samples extremely difficult. This problem is even more acute when the magnitude of the color subcarrier reference burst signal is substantially below its nominal level (e.g., one-fourth of the nominal level is not uncommon) in which case the desired phase-lock error (e.g., $\pm 1°$) is less than that represented by a one least significant bit (LSB) change in the digitized representation of the color subcarrier reference burst magnitude.

Accordingly, the present invention measures the phase of a sampled signal developed in accordance with a sampling signal having a phase changed in predetermined increments. Indications that the magnitudes of the sampled signals are within a predetermined range of values are stored to produce a measure of phase. Features of the invention include measuring apparatus and measuring method, and phase-locked loop apparatus including such measuring apparatus.

In The Drawing:

FIGS. 4, 5 and 6 are schematic diagrams, partially in block diagram form, of embodiments of portions of the system of FIG. 1.

Figure 1:
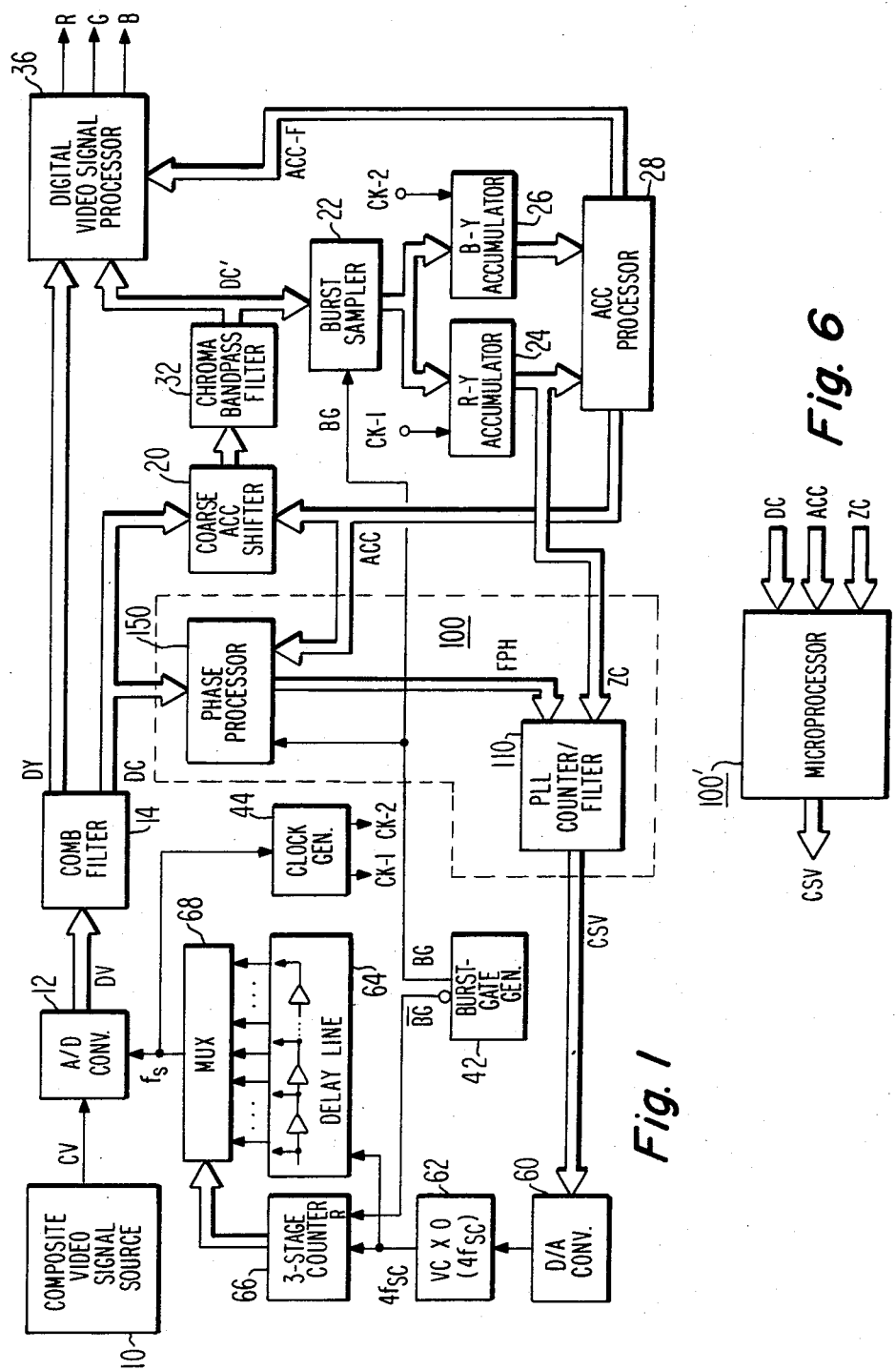
FIG. 1 is a schematic diagram in block diagram form of a system including an embodiment of the present invention.

In the drawing, broad arrows represent signal paths for parallel multiple-bit digital signals and line arrows represent signal paths for analog signals or single-bit digital signals.

Composite analog video signals CV are provided by signal source 10 of FIG. 1 which includes, for example, a tuning system, an intermediate frequency section and a video detector as in a conventional TV receiver. Analog-to-digital converter (ADC) 12 converts the composite analog video signals CV into eight-bit digital video samples at a rate determined by the frequency of sampling signal $f_s$. Sampling signal $f_s$ is at a frequency $4f_{sc}$ which is four times the color subcarrier frequency and, as will be described below, in phase and frequency lock with the color subcarrier reference burst signal. Sampling signal $f_s$ is employed as a clocking signal for the digital signal processing circuitry.

Digital comb filter 14 separates digital video samples DV into digital luminance samples DY and digital chrominance samples DC. The magnitude of the digital chrominance samples are scaled by an automatic chrominance control (ACC) so as to be close to a nominal chrominance signal level. The inital coarse scaling is provided by coarse ACC shifter 20 in accordance with a coarse scaling signal ACC which represents the actual magnitude of the color subcarrier reference burst signal relative to its desired (nominal) unit peak-to-peak magnitude. Shifter 20, for example, shifts the bits of digital chrominance samples DC to higher-order bit positions or to lower-order bit positions so that the chrominance samples at the output of shifter 20 are between one and two times the desired (nominal) magnitude. Digital bandpass filter 32 has a passband centered near the color subcarrier frequency $f_{sc}$ to limit the bandwidth of the chrominance samples DC' applied to processor 36.

Digital video signal processor 36 includes digital circuitry to process digital luminance samples DY and digital chrominance samples DC' so as to develop color drive signals R, G and B which are applied to a kinescope (not shown) to develop a TV image. Processor 36 includes, for example, a fine gain ACC element, such as a digital multiplier, which more precisely scales the magnitude of the digital chrominance samples to the desired nominal value thereof in accordance with fine scaling signal ACC-F.

Figure 2:
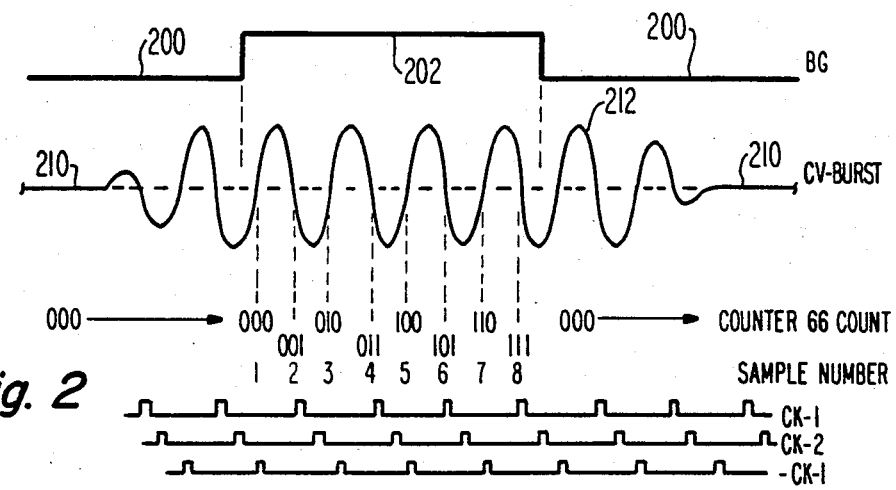
FIGS. 2 and 3 illustrate waveforms related to the apparatus of FIG. 1.

The foregoing description considered the video processing signal path; the following description concerns operation of the ACC circuitry and the phase and frequency locking circuitry. Each TV line (excepting certain lines within the vertical blanking interval) includes a color subcarrier reference burst signal CV-BURST shown in FIG. 2. Levels 210 represent the level of signals CV upon which the reference burst signal 212 is superimposed. Burst gate generator 42 of FIG. 1 develops burst gate signal BG at a low level 200 at all times except during the central portion (e.g., the central four cycles) of reference burst signal 212, at which time it is at high level 202. During the interval of level 202, the amplitude and phase of the reference burst signal are measured to provide information permitting magnitude standardization by the ACC circuitry and the phase and frequency locking of sampling signal $f_s$. Inverse burst gate signal $\overline{BG}$ is the logical inversion of burst gate signal BG. For ease of understanding, FIG. 2 illustrates signal CV-BURST as an analog waveform, although it is understood that digitized samples thereof are processed by the ACC and phase locking circuitry described below.

Clock generator 44 includes counting and gating circuits to develop various clocking signals in response to sampling signal $f_s$. For example, clocking signals CK-1 and CK-2 as shown in FIG. 2 are developed at one-fourth the rate of sampling signal $f_s$ so as to occur at phases of the chrominance subcarrier signal separated by 90°. When the system is in phase and frequency lock, CK-1 is aligned with the negative-going zero crossings of reference burst signal 212, CK-2 is aligned with the negative peaks thereof, and $-$CK-1 is aligned with the positive-going zero crossings thereof.

Burst sampler 22 of FIG. 1 responds to burst gate signal BG to apply those digital chrominance samples DC' representing the color subcarrier reference burst signal 212 to digital accumulators 24 and 26. Accumulator 24 is responsive to clocking signal CK-1 to accumulate the magnitudes of DC' samples at the (R-Y) phase and accumulator 26 is responsive to clocking signal CK-2 to accumulate the magnitudes of DC' samples at the (B-Y) phase.

ACC processor 28 develops the coarse ACC scaling value ACC and the fine ACC scaling value ACC-F from the accumulated (R-Y) and (B-Y) magnitudes. Processor 28 operates upon the accumulated (R-Y) and (B-Y) magnitudes in a manner which is independent of the presence or absence of phase locking of sampling signal $f_s$. A satisfactory phase-independent processor is described in U.S. patent application Ser. No. 428,591 entitled AUTOMATIC COLOR BURST MAGNITUDE CONTROL FOR A DIGITAL TELEVISION RECEIVER, which is assigned to the same assignee as is the present invention and is incorporated herein by reference.

Phase measuring apparatus 100 develops from the magnitudes of samples DC a measure, CSV, of the error between the phase of sampling signal $f_s$ and the phase of the color subcarrier reference burst 212. Phase-locked loop (PLL) counter and low-pass filter 110 provides initial frequency and phase locking in response to the accumulated value ZC of the burst signal at what should be zero-crossing points thereof. The value of ZC changes the count stored in a counter included in PLL counter/filter 110 in the direction that causes the value ZC to approach zero. This stored count is produced control signal CSV. The PLL thus far described is limited, however, to reducing the phase error to that remaining when the accumulated zero-crossing magnitude ZC is zero. When ZC is zero, sampling signal $f_s$ and burst 212 are phase locked within a residual phase error of about $\pm 3.6°$ (for a color subcarrier burst signal magnitude of about 10 IRE units). That residual phase error is significantly greater than the desired $\pm 1°$ maximum phase error.

To reduce the residual phase error further, phase processor 150 develops fine phase signals FPH in response to particular samples of digital chrominance signals DC produced by comb filter 14 having magnitudes within a range of values encompassing the zero value. The boundaries of the range of values are adjusted in response to the level of the color reference burst signal as indicated by the control signal ACC. Fine-phase signals FPH developed by processor 150 are applied to counter/filter 110 to change the control signal value CSV to reduce the residual phase error even further, as will be described below.

Control signal CSV is applied to digital-to-analog converter (DAC) 60 which develops a corresponding analog control voltage which is applied to voltage-controlled crystal oscillator (VCXO) 62. VCXO 62 generates a clocking signal $4f_{sc}$ at four-times the nominal frequency of the color subcarrier signal and which is controlled to be at exactly four-times the frequency of the received color subcarrier reference burst signal by the control voltage developed by DAC 60. Sampling signal $f_s$ is developed from clocking signal $4f_{sc}$ as follows.

Delay line 64 includes a plurality of delaying elements to successively delay the clocking signal $4f_{sc}$. It is satisfactory that seven delaying elements be employed so that eight signals (one of which is undelayed and seven of which are delayed by successively greater times) are developed. Each delay element comprises, for example, a CMOS buffer amplifier which has a nominal signal propogation delay of about 1.6 nanoseconds which is equivalent to about 2.06° of phase shift at the color subcarrier frequency. Thus, clocking signals delayed by about 0°, 2°, 4°, 6°, . . . and 14° are produced by delay line 64.

The eight successively delayed clocking signals produced by delay line 64 are applied to multiplexer (MUX) 68 which produces a selected one delayed signal in accordance with a control signal received from counter 66. Three-stage counter 66 is held reset at times other than during the burst gate interval (level 202) by the inverted burst gate signal $\overline{BG}$ applied to its reset input R. Thus counter 66 produces a count 000 which controls MUX 68 to produce, for example, the undelayed signal $4f_{sc}$ as sampling signal $f_s$. During the burst gate interval, which is also the phase measuring interval, counter 66 counts in response to clocking signal $4f_{sc}$ to develop a sequence of control signal counts which control MUX 68 to develop sampling signal $f_s$ having successively increasing delays. The counts of counter 66 and the corresponding sample numbers are illustrated in FIG. 2. Thus, during the burst gate interval, sampling clock $f_s$ controls ADC 12 to sample the analog composite video signals CV at increasingly delayed times.

Figure 3:
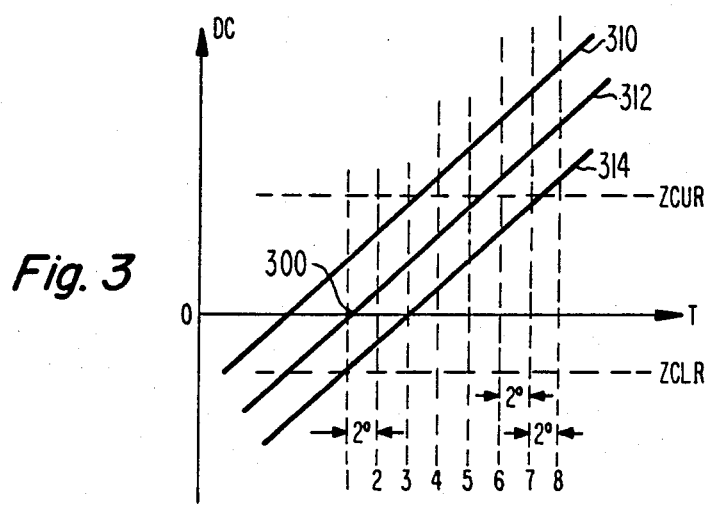

The method of phase measurement of the present invention is described in relation to FIG. 3 which illustrates the sampling sequence just described. Line 312 represents the portion of burst signal 212 near its zero-crossing point 300 on time axis T. Zero crossing point 300 represents the condition when burst signal 212 is exactly aligned (0° phase error) in phase with sampling signal $f_s$ when sampling signal $f_s$ is the undelayed clocking signal $4f_{sc}$. I.e., counter 66 is at count 000 at sample number 1 so that MUX 68 selects the clocking signal $4f_{sc}$ which is not delayed as sampling signal $f_s$.

For purposes of illustration and description, signal polarities for negative-going zero crossings are reversed so that all eight samples are depicted as if they are positive-going zero crossings in FIG. 3. Thus, line 312 represents eight zero crossings and the eight vertical dashed lines represent the successively delayed phases of sampling signal $f_s$ corresponding to sample numbers 1–8. Samples 1, 3, 5 and 7 are samples of positive-going zero crossings and samples 2, 4, 6 and 8 are samples of negative-going zero crossings, as can be seen from FIG. 2. Similarly, line 310 represents the eight zero crossings of the portion of the color burst signal 212 when it leads by 4° (phase error $\Delta\Phi = +4°$) and line 314 represents that portion when it lags by 4° ($\Delta\Phi = -4°$).

The intersections of lines 310, 312 and 314 with each of the vertical dashed lines indicate the values of digital chrominance samples DC which are produced for each sample in each of the three cases illustrated (i.e. $\Delta\Phi = +4°$, 0°, $-4°$). As $f_{sc}$ is delayed by about 2° for each successive sample, the magnitude of the DC sample also increases. Of the eight samples for each case, differing numbers of the samples are within a range of values bounded by the horizontal dashed lines representing a zero crossing upper reference value ZCUR and a zero crossing lower reference value ZCLR. The number of samples of DC within this range is an indication of the phase error between the color subcarrier reference burst signal and the VCXO signal $4f_{sc}$, and is employed to develop a fine phase correction to decrease the phase error. FIG. 3 includes a table setting forth the number CT of samples falling within the range bounded by ZCUR and ZCLR for the three illustrated cases of phase error $\Delta\Phi = +4°$, $0°$, $-4°$. The range of values employed is preferably a small portion of the possible magnitudes of samples DC. As is described below, values represented by the three least significant bits of eight-bit samples DC are satisfactory.

The phase measurement method just described is concisely stated as follows. A reference signal is sampled a given number of times (e.g., 8) each of which is delayed in phase by a given amount (e.g., 2°) from the previous sample. The number of samples having values within a given range of values (e.g., between ZCUR and ZCLR) are counted (e.g., CT) to provide an indication of phase difference between the sampling signal and the reference signal. Further, as in the system of FIG. 1, the count indication can be employed to effect a change in the phase of the sampling, such as for providing a predetermined phase relationship (e.g., $\Delta\Phi = 0$).

Figure 4:
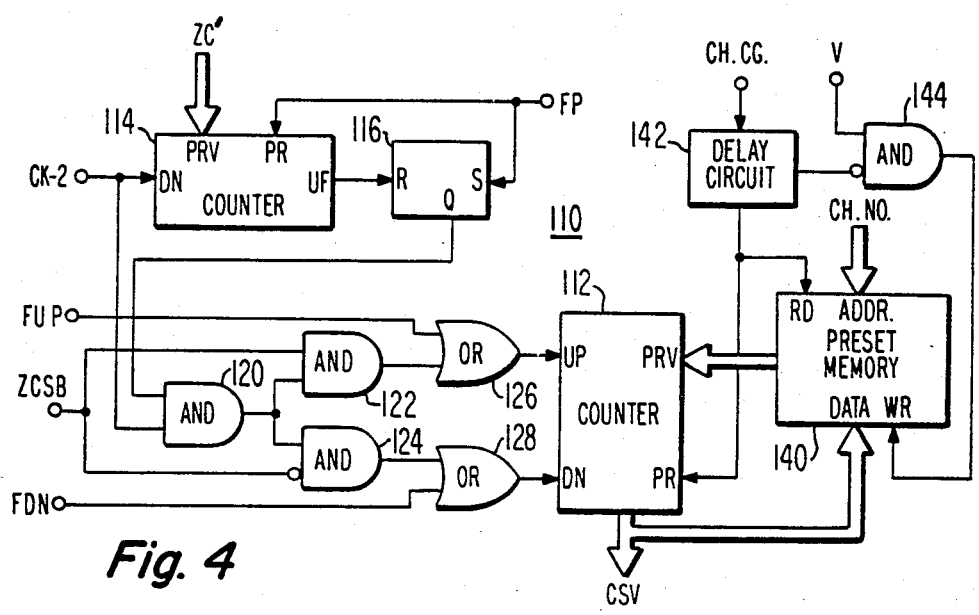
Figure 5:
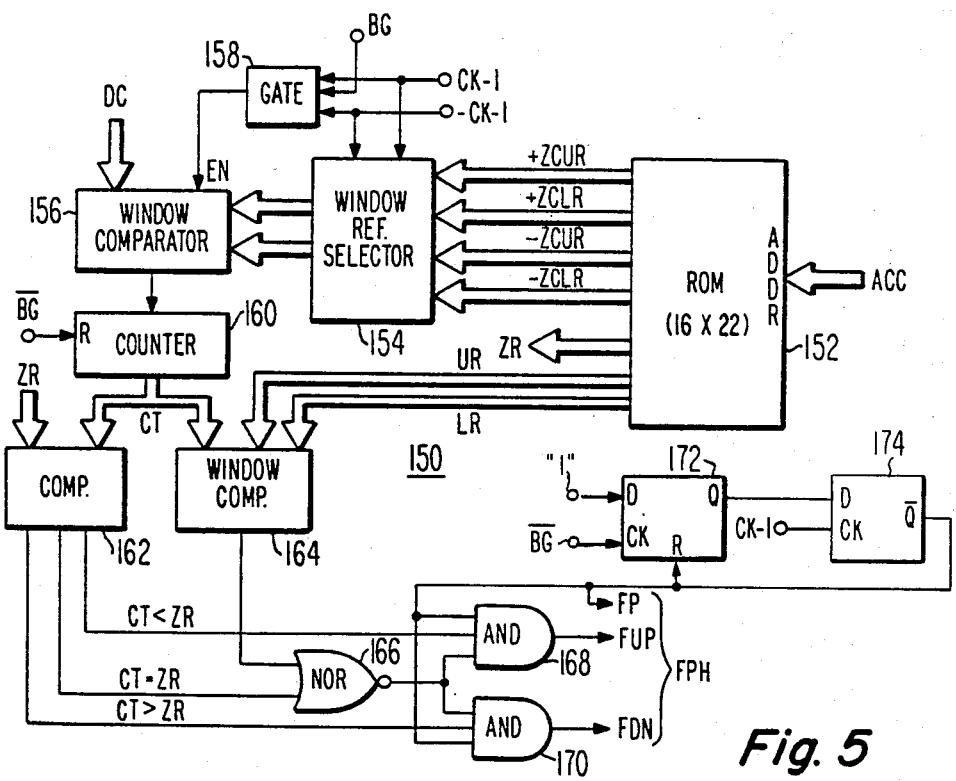

Exemplary embodiments of phase measuring circuit 100 are shown in FIGS. 4 and 5 which show embodiments of PLL counter/filter 110 and phase processor 150, respectively. PLL counter and filter 110 of FIG. 4 includes a four-bit counter 114 which is active for the initial (coarse) phase and frequency locking. Accumulated zero value signal ZC' of FIG. 4 which corresponds to a signed-binary equivalent to the twos complement value ZC produced by accumulator 24. Counter 114 receives the accumulated zero crossing magnitude ZC' at its presetting value input PRV, which magnitude is stored therein in response to the application of a pulse FP to its preset enable input PR. Pulse FP is a single pulse developed following the transition from level 202 to level 200 of burst gate signal BG, as is described below. Pulse FP sets flip-flop 116 which provides an enabling level to the input of AND gate 120. Counter 114 counts down from the preset value ZC' in response to clocking signal CK-2 applied to its count down input DN. Counter 114 produces an underflow signal at its output UF when its count reaches zero. The signal at output UF resets flip-flop 116 disabling AND gate 120. Clocking signal CK-2 is applied to the second input of AND gate 120 which produces, during the time it is enabled by flip-flop 116, a number of pulses equal to the preset value ZC'.

Twelve-bit up-down counter 112 stores a count which is produced as the control signal value CSV described above in relation to FIG. 1. AND gates 122 and 124 direct the pulses produced by AND gate 120 to the count up input UP of counter 112 via OR gate 126 when the accumulated zero crossing value is negative (i.e. its sign bit ZCSB=1) and to the count down input DN via OR gate 128 when the accumulated zero crossing value is positive (i.e., its sign bit ZCSB=0). Thus, the count stored in counter 112 increase or decrease according to the zero crossing value until, by the negative feedback action of DAC 60 and VCXO 62 of the PLL, a zero value indicating phase and frequency lock is reached. Because the number of counting pulses applied to counter 112 via gates 120–128 is directly related to the magnitude of ZC' which indicates phase error magnitude, frequency and phase lock is rapidly achieved. It is noted that in the phase lock condition, counter 114 is preset to zero value and immediately produces an underflow UF indication to hold flip-flop 116 reset so that AND gate 120 blocks clocking signal CK-2 continuously.

In addition, fine-up pulses FUP and fine-down pulses FDN, developed by phase processor 150, are applied via OR gates 126 and 128, respectively, to the count up input UP and count down input DN, respectively, of counter 112 to change the count stored therein to further decrease the phase error. The remainder of FIG. 4 provides a feature which is described following the description of FIG. 6.

Phase processor 150 shown in FIG. 5 performs the phase measuring method described above in relation to FIG. 3. Window reference selector 154 responds to clocking signals CK-1 and −CK-1 to apply the boundary levels +ZCUR and +ZCLR to comparator 156 for positive-going zero crossing comparisons and to apply the boundary levels −ZCUR and −ZCLR to comparator 156 for negative-going zero crossing comparisons. Window comparator 156 compares digital chrominance samples DC to the selected boundary levels to produce an output when the magnitude thereof is within the range of values delineated by the selected boundary levels. Comparator 156 is enabled on zero crossings by gate 158 which detects coincidence of burst gate signal BG and either of clocking signals CK-1 or −CK-1.

Counter 160 is held reset by inverted burst gate signal $\overline{BG}$ applied to its reset input R and is enabled thereby to count during the burst gate interval. The count CT stored in counter 160 is the number of the eight zero crossing samples of digital chrominance samples DC having values in the range detected by comparator 156. Comparator 162 compares the count value CT to the correct count ZR which is the value that CT would be if the phase error was at its minimum level (i.e., $\Delta\Phi = 0°$). Comparator 162 applies an enabling level to AND gate 168 if CT<ZR which indicates that the FUP pulse should be developed to increase the count of counter 112 of PLL counter/filter 110. Comparator 162 applies an enabling level to AND gate 170 if CT>ZR which indicates that the FDN pulse should be developed to decrease the count of counter 112. Comparator 162 applies a high level to NOR gate 166 which prevents AND gates 168 and 170 from developing pulses FUP and FDN when CT=ZR, i.e. when the minimum phase error condition is achieved.

Window comparator 164 develops a low output when the count value CT is between the minimum and maximum count values LR and UR, respectively. LR and UR indicate the count values equivalent to the limits of phase error over which the fine phase measuring circuitry of processor 150 is to control the VCXO 62, i.e., for UR>CT>LR. NOR gate 166 responds to comparator 164 to apply an enabling level to AND gates 168 and 170 only when the fine correction pulses FUP and FDN are to be developed, i.e., specifically when comparator 164 indicates UR>CT>LR provided that comparator 162 does not detect CT=ZR.

When AND gate 168 is enabled by comparator 162 and NOR gate 166, it passes pulse FP as fine-up pulse FUP. When AND gate 170 is enabled by comparator 162 and NOR gate 166, it passes pulse FP as fine-down pulse FDN. Because counter 112 of PLL counter/filter 110 is increased or decreased by pulses FUP and FDN by only one count for each TV line so that its count can only change relatively slowly, it also serves as a low-pass filter for the PLL. It is noted that pulse signals FP, FUP and FDN of FIGS. 4 and 5 together are designated as fine phase pulses FPH of FIG. 1. In FIG. 5, positive-edge triggered D-flip-flops 172 and 174 respond to inverted burst gate signal $\overline{BG}$ and clocking signal CK-1 to develop pulse FP having a duration corresponding in time to the one cycle of CK-1 next following the termination of the burst gate interval, i.e. next following the positive-going transition of $\overline{BG}$.

The values of the various comparison signals applied to comparators 156, 162 and 164 are affected by the magnitude of the color subcarrier reference burst signal and by whether the zero crossing for which comparison is being made is positive- or negative-going. A read-only memory (ROM) 152 produces these various comparison signals in response to application of four bits of control signal ACC to the address input ADDR of ROM 152. Each of the sixteen addressable storage locations of ROM 152 stores twenty-two bits which comprise six three-bit portions of the six comparison signals +ZCUR, +ZCLR, −ZCUR, −ZCLR, ZR and LR and a four-bit comparison signal UR. Because the five most significant bits (MSB) of the eight-bit two's complement comparison signals +ZCUR, +ZCLR, −ZCUR and −ZCLR, and the one MSB of the four-bit binary comparison signals ZR and LR, do not change, they are provided by wired connections to logically high or logically low voltages rather than by ROM 152. Thus, ROM 152 need have only a small number of storage cells owing to the values of the boundary levels being only a small portion (i.e. the three LSBs) of the possible magnitudes (i.e. eight bits) of the chrominance samples DC. Further, because the upper and lower boundary values are oppositely signed, the zero-crossing point is emcompassed within the range of values producing countable indications. TABLE I sets forth the stored bits of the seven comparison signals as a function of the magnitude of the color subcarrier reference burst signal and sets forth the logical level of the MSBs thereof which do not change.

tudes of color subcarrier reference burst samples to change the phase of a sampling signal until it is phase locked to within about ±3.6° of the burst signal zero crossings. During this coarse mode, the stored count changes in proportion to the magnitude of the burst samples so that phase locking from large phase error conditions is achieved rapidly. Thereafter, a fine lock is accomplished by increasing or decreasing the stored count in accordance with the number of samples falling within boundary values close to the zero crossing point. These samples are produced in response to a sequence of successively increasing small phase errors being introduced. The stored count is increased or decreased relatively slowly, e.g., at a once per line rate. When the phase error has been thereby reduced so that the number of samples falling within the boundary values indicates that no further correction is attainable, the stored count is prevented from changing. At this condition, the phase error is less than about ±0.9° which is less than the desired ±1° tolerance.

FIG. 6 shows phase measuring circuit 100 comprising microprocessor 100'. Microprocessor 100' performs, in response to a stored program and the signals DC, ACC and ZC applied thereto, the method described hereinabove to calculate the control signal value CSV for controlling VCXO 62.

Modifications are contemplated to the present invention within the scope of the claims following. For example, it is satisfactory that phase measuring circuit 100 responds only to positive-going or negative-going zero crossing samples rather than to both as described herein. While such modification reduces the number of samples processed, it permits simplification of phase processor 150. Further, either a greater or lesser number of samples than the eight herein described may be used.

FIG. 4 shows a modification providing a feature for decreasing the time required to achieve phase locking in a TV receiver. Preset memory 140 receives control signal value CSV at its data input DATA and receives the selected TV channel number CH.NO. at its address input ADDR. Vertical drive pulses V are applied by AND gate 144 to the write input WR thereby causing the most recent control signal value CSV to be stored in a memory location of memory 140 having the selected channel number as its address. Upon the changing of a

TABLE 1

| (IRE Units, Peak-to-peak) | Color Burst Magnitude | | | | | | |
|---|---|---|---|---|---|---|---|
| | −ZCLR Value | −ZCUR Value | +ZCLR Value | +ZCUR Value | ZR Value | LR Value | UR Value |
| 10.0–11.25 | 110 | 001 | 111 | 010 | 101 | 011 | 0111 |
| 11.26–13.75 | 110 | 001 | 111 | 010 | 100 | 010 | 0110 |
| 13.76–15.0 | 110 | 001 | 111 | 010 | 011 | 001 | 0101 |
| 15.01–16.25 | 101 | 010 | 110 | 011 | 110 | 100 | 1000 |
| 16.26–18.75 | 101 | 010 | 110 | 011 | 101 | 011 | 0111 |
| 18.76–20.00 | 101 | 010 | 110 | 011 | 100 | 010 | 0110 |
| 20.01–22.50 | 100 | 010 | 110 | 100 | 110 | 100 | 1000 |
| 22.51–27.50 | 100 | 010 | 110 | 100 | 101 | 011 | 0111 |
| 27.51–30.00 | 100 | 010 | 110 | 100 | 100 | 010 | 0110 |
| 30.01–40.00 | 011 | 011 | 101 | 101 | 101 | 011 | 0111 |
| 40.01–60.00 | 011 | 011 | 101 | 101 | 100 | 010 | 0110 |
| Logic level of changing MSBs | 1 | 0 | 1 | 0 | 0 | 0 | — |

The opertaion of phase measuring circuit 100 including PLL counter 110 and phase processor 100 and its cooperation with VCXO 62, delay line 64 and MUX 68 of the PLL is summarized as follows. Initial or coarse phase lock is accomplished by increasing and decreasing a stored count (110) in accordance with the magnichannel, but before the channel number signal CH.NO. changes, channel change signal CH.CG. activates delay circuit 142 to disable AND gate 144 from causing data to be written into memory 140. Then, after the channel number signal CH.NO. addressing memory 140 changes, delay circuit 142 applies a signal to the read input RD of memory 140 and to the preset input PR of counter 112 thereby to preset the value of control signal CSV in counter 112 to the value it had the last time that the newly selected channel was selected.

It is further contemplated that the present invention be employed in sampled data systems of various sorts, of which the digital system described herein is but an example.

What is claimed is:

1. Measuring apparatus comprising:
   a source of sampled signals developed in accordance with a sampling signal;
   phasing means coupled to said source for changing the phase of said sampling signal in predetermined increments;
   comparing means coupled to said source for developing indications that said sampled signals have magnitudes within a predetermined range of values; and
   counting means coupled to said comparing means for counting the number of said indications to produce a measure of the phase of said sampled signals.

2. The apparatus of claim 1 wherein said phasing means comprises:
   delaying means to which a clocking signal is applied for developing a plurality of successively delayed clocking signals; and
   selecting means coupled to said delaying means for selecting ones of said plurality of successively delayed clocking signals to develop said sampling signal.

3. The apparatus of claim 1 wherein said comparing means comprises:
   reference source means for providing signals representative of the boundaries of said predetermined range of values; and
   a comparator to which said sampled signals and said boundary representative signals are applied for developing said indications.

4. The apparatus of claim 3 wherein said reference source means comprises:
   means for developing said addressing signals in response to said sampled signals; and
   addressable storing means for producing said boundary representative signals stored therein in accordance with said addressing signals applied thereto.

5. The apparatus of claim 4 wherein said means for developing is responsive to the magnitude of said sampled signals.

6. The apparatus of claim 4 wherein said reference source means further comprises means coupled to said addressable storing means for selecting ones of said boundary representative signals in accordance with increasing and decreasing magnitudes of said sampled signals.

7. Phase locking apparatus comprising:
   oscillator means for generating a clocking signal having a frequency responsive to a control signal;
   phasing means coupled to said oscillator means for changing the phase of said clocking signal in predetermined increments to develop a sampling signal;
   a source of sampled signals developed in accordance with said sampling signal;
   comparing means coupled to said source for developing indications that said sampled signals have magnitudes within a predetermined range of values;
   counting means coupled to said comparing means for counting the number of said indications to produce a measure of the phase of said sampled signals; and
   control means coupled to said counting means for developing said control signal for said oscillator means in response to said measure of the phase of said sampled signals.

8. The apparatus of claim 7 wherein said phasing means comprises:
   delaying means to which said clocking signal is applied for developing a plurality of successively delayed clocking signals; and
   selecting means coupled to said delaying means for selecting ones of said plurality of successively delayed clocking signals to develop said sampling signal.

9. The apparatus of claim 7 wherein said comparing means comprises:
   reference source means for providing signals representative of the boundaries of said predetermined range of values; and
   a comparator to which said sampled signals and said boundary representative signals are applied for developing said indications.

10. The apparatus of claim 9 wherein said reference source means comprises:
    means for developing said addressing signals in response to said sampled signals; and
    addressable storing means for producing said boundary representative signals stored therein in accordance with said addressing signals applied thereto.

11. The apparatus of claim 10 wherein said means for developing is responsive to the magnitude of said sampled signals.

12. The apparatus of claim 10 wherein said reference source means further comprises means coupled to said addressable storing means for selecting ones of said boundary representative signals in accordance with increasing and decreasing magnitudes of said sampled signals.

13. The apparatus of claim 7 wherein said control means comprises:
    second counting means for storing a count representative of said control signal;
    second control means coupled to said first counting means and responsive to the number of said indications for increasing and decreasing the count stored in said second counting means; and
    converting means coupled to said second counting means for converting the count stored therein into said control signal.

14. The apparatus of claim 13 wherein said control means further comprises:
    second comparing means for comparing the magnitudes of predetermined ones of said sampled signals and a reference magnitude to develop an error signal;
    means coupled to said second comparing means and to said second control means, for inhibiting the increasing and decreasing of the count stored in said second counting means when said error signal exceeds a predetermined value; and
    means, coupled to said second comparing means and to said second counting means, for changing the count of said second counting means in accordance with the magnitude of said error signal when said error signal exceeds said predetermined value.

15. In a television receiver including a source of analog video signals having color subcarrier reference burst and color information components, apparatus comprising:

analog-to-digital converting means coupled to said source for developing video samples representing said analog video signals in accordance with a sampling signal;

phasing means coupled to said analog-to-digital converting means for changing the phase of said sampling signal in predetermined increments when said video samples representing said color subcarrier reference burst component are developed;

comparing means coupled to said analog-to-digital converting means for developing indications that said video samples representing said color subcarrier reference burst component have magnitudes within a predetermined range of values;

counting means coupled to said comparing means for counting the number of said indications to produce a measure of the phase of said video samples representing said color subcarrier reference burst component; and control means coupled to said counting means and responsive to said measure of the phase for controlling the phase of said sampling signal.

16. The apparatus of claim 15 wherein said control means comprises oscillator means for generating a clocking signal having a phase responsive to a control signal, and means for developing said control signal in response to said measure of the phase.

17. The apparatus of claim 16 wherein said phasing means comprises:

delaying means to which said clocking signal is applied for developing a plurality of successively delayed clocking signals; and selecting means coupled to said delaying means for selecting a sequence of ones of said plurality of successively delayed clocking signals to develop said sampling signal when said video samples representing said color subcarrier reference burst component are developed and for otherwise selecting a predetermined one thereof to develop said sampling signal.

18. The apparatus of claim 15 wherein said comparing means comprises:

reference source means for providing signals representative of the boundaries of said predetermined range of values; and a comparator to which said video samples and said boundary representative signals are applied for developing said indications.

19. The apparatus of claim 18 wherein said reference source means comprises:

means for developing said addressing signals in response to said video samples; and addressable storing means for producing said boundary representative signals stored therein in accordance with said addressing signals applied thereto.

20. The apparatus of claim 19 wherein said reference source means further comprises means coupled to said addressable storing means for selecting ones of said boundary representative signals in accordance with increasing and decreasing magnitudes of said video samples.

21. A method for measuring the phase of a sampled signal developed in accordance with a sampling signal, comprising the steps of:

(a) for a first signal sample:

(1) determining whether said signal sample has a magnitude within a predetermined range of values and, if so, developing an indication thereof;

(2) counting the indication so developed; and (3) changing the phase of said sampling signal by a predetermined phase increment; and (b) for a predetermined number of subsequent signal samples, repeating steps (a)(1), (a)(2) and (a)(3) for each one of said predetermined number of subsequent signal samples;

(c) producing the counted number of said indications stored in steps (a) and (b) as the measure of said phase.

* * * * *